US006874132B1

(12) United States Patent
Bhamidipaty (10) Patent No.: US 6,874,132 B1
(45) Date of Patent: Mar. 29, 2005

(54) EFFICIENT EXTRACTOR FOR POST-LAYOUT SIMULATION ON MEMORIES

(75) Inventor: Achyutram Bhamidipaty, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 226 days.

(21) Appl. No.: 10/242,343

(22) Filed: Sep. 11, 2002

(51) Int. Cl.[7] .............................................. G06F 17/50
(52) U.S. Cl. .............................. 716/1; 716/18; 716/4; 716/5
(58) Field of Search .............................. 716/1, 18, 4, 5

(56) References Cited

U.S. PATENT DOCUMENTS

| 6,184,711 | B1 | * | 2/2001 | Graef et al. ................... 326/41 |
| 6,289,412 | B1 | * | 9/2001 | Yuan et al. ..................... 703/14 |
| 6,463,571 | B1 | * | 10/2002 | Morgan .......................... 716/5 |
| 6,499,129 | B1 | * | 12/2002 | Srinivasan et al. ............. 716/4 |
| 6,505,323 | B1 | * | 1/2003 | Lipton et al. ................... 716/3 |
| 6,543,032 | B1 | * | 4/2003 | Zolotykh et al. .............. 716/2 |

* cited by examiner

*Primary Examiner*—Vuthe Siek
*Assistant Examiner*—Magid Y. Dimyan
(74) *Attorney, Agent, or Firm*—Bever, Hoffman & Harms LLP; Jeanette S. Harms (57) ABSTRACT

Embodiments of the present invention relate to a computer-controlled method for extracting cell parasitic characteristics for netlist back-annotation in a circuit that comprises a row and column array of repeated cells. The method comprises the steps of generating parasitic and connection data for a row and a column of said cells in the arrayed circuit, duplicating the generated parasitic data for an additional row and an additional column in the arrayed circuit; synthesizing connection data for the additional row from a connected cell in that additional row; synthesizing connection data for the additional column from a connected cell in that additional column, and making the generated parasitic data and the synthesized connection data available for subsequent back-annotation of the netlist.

25 Claims, 6 Drawing Sheets

```
.subckt bit wl bl
ml wl bl nd gnd n
cl nd gnd 2off
.ends

.subckt col1 w10 w11 w12 w13 bl
x0 w10 bl bit
x1 w11 bl bit
x2 w12 bl bit
x3 w13 bl bit
.ends .subckt col w10 w11 w12 w13 w14 w15 w16 w17 bl
x0 w10 w11 w12 w13 bl col1
x1 w14 w15 w16 w17 bl col1
.ends .subckt bank
x0 w10 w11 w12 w13 w14 w15 w16 w17 bl0 col
x1 w10 w11 w12 w13 w14 w15 w16 w17 bl0 col
x2 w10 w11 w12 w13 w14 w15 w16 w17 bl0 col
x3 w10 w11 w12 w13 w14 w15 w16 w17 bl0 col
.ends .subckt bank w10 w11 w12 w13 w14 w15 w16 w17 bl0 bl1 bl2 bl3
x0 w10 w11 w12 w13 w14 w15 w16 w17 bl0 col
x1 w10 w11 w12 w13 w14 w15 w16 w17 bl1 col
x2 w10 w11 w12 w13 w14 w15 w16 w17 bl2 col
x3 w10 w11 w12 w13 w14 w15 w16 w17 bl3 col
.ends xtop w10 w11 w12 w13 w14 w15 w16 w17 w18 bl0 bl1 bl2 bl3 bank
``` a) NET w13

$$\left\{ \begin{matrix} . \\ . \\ . \\ . \end{matrix} \right\}$$

EFFICIENT EXTRACTOR FOR POST-LAYOUT SIMULATION ON MEMORIES

FIELD OF THE INVENTION

Embodiments of the present invention relate to the field of integrated circuit simulation and verification.

BACKGROUND OF THE INVENTION

Modern integrated circuits have become ever more complex. Memory chips, especially, have become ever denser and ever smaller as the art has progressed. The complexity of modern electronic devices means that, though unit cost is small, implementing a design on silicon can be enormously expensive. In order to perform the tasks in a cost effective manner, both pre-layout and post-layout simulation is vital to the evaluation of a design.

Pre-layout simulation of any design is only as effective as the information fed to the simulation engine. Once, digital designs were large enough that digital considerations were dominant over any analog considerations and were easily learned and input to a simulation netlist. Now, as integrated circuits move to incorporate ever smaller features, these high-speed, low-power, digital circuits exhibit increasingly analog behavior because of complex electrical and physical interactions in and among the physical features of the silicon. These include inductance effects, capacitance effects, resistance, cross coupling, and electron migration; phenomena that may not be understood in pre-layout but must be known and input into a netlist in post-layout simulation and must be known in order to characterize the device. This is vital to avoid a non-functional design when fabricated that was successfully verified in pre-layout simulation.

Furthermore, the integration of modern, high-density, chip designs into the multi-device systems in which they ultimately function must account for device characteristics as actually implemented. Characteristics can deviate from design expectations due to the complex internal interaction phenomena mentioned above. Determining these phenomena must be accomplished through post-layout verification because performance cannot be simply extrapolated from the isolated analysis of idealized performance of individual cells or elements. Verification methods based on full-chip circuit-level simulation are meeting increasing requirements for the larger capacity, faster, and more accurate verification and analysis needed to deliver first-time working silicon devices, and first-time working systems.

To achieve reliable simulation and verification characteristics, particularly parasitic resistance and capacitance characteristics, simulation netlists should be back-annotated with data as soon as they are learned and updated. In a memory chip with billions of almost-identical individual features that each have their own characteristics, analyzing each cell or other feature individually presents a task that is time-consuming beyond reach in the modern competitive environment.

SUMMARY OF THE INVENTION

Accordingly, embodiments of the present invention are directed to a method and system by which characteristics required for netlist back-annotation can be accurately learned in a timely manner. The disclosed method operates within the present scope of device design and verification processes and provides back-annotated information to existing simulation engines.

Embodiments of the present invention relate to a computer-controlled method for extracting cell parasitic characteristics for netlist back-annotation in a circuit that comprises a row and column array of repeated cells. The method comprises the steps of generating parasitic and connection data for a row and a column of said cells in the arrayed circuit, duplicating the generated parasitic data for an additional row and an additional column in the arrayed circuit; synthesizing connection data for the additional row from a connected cell in that additional row; synthesizing connection data for the additional column from a connected cell in that additional column, and making the generated parasitic data and the synthesized connection data available for subsequent back-annotation of the netlist.

Within an arrayed device upon which an embodiment is employed, a core cell is the subcircuit that is replicated to create the array. The back annotation information (BA), of DSPF or SPEF format, for a particular node in the design is described by the back-annotated, post-layout, netlist. In one example, this is a resistor/capacitor (RC) network with ports. The RC network ports specify the instance in the pre-layout design and port on that instance that connect to a particular port on the RC network. The BA port represents the connection from the parasitics for a node in the actual (i.e. physical, non-ideal) design to an instance and port in the ideal, pre-layout, design.

In standard memory arrays (SRAM and DRAM) the core cells are connected to each other in two dimensions. There are row nodes that touch all core cells in a particular row. Similarly there are column nodes that touch all core cells in a column. There are typically other less important nodes as well.

The embodiments of the present invention may process a design in question that is an arrayed circuit of some sort, e.g., an SRAM memory, DRAM memory, Flash array, LCD screen, etc. The array is typically a replicated core cell. Also assumed is that the user has somehow generated the extracted parasitic data for one row and one column in each array. In the general case, large circuits will have multiple arrays within the design.

Since each array has BA information for only one row and one column, the novel process can split the rows and columns into those that have BA information and those that do not.

For every row (column) in an array that does not have BA information, the process performs the following. First, duplicate the BA information for the one row (or column) that does have BA information. Let the original BA information be the master BA information and the duplicated BA information be the slave BA information. Secondly, the connection (port) information for the slave BA information is wrong because it corresponds to the connections for the master BA information; this is incorrect information and is discarded. After discarding the wrong connection information what is left is an RC network with ports but no information on how to connect those ports to design instances and ports.

The goal of the next step is to compute the full instance and port information for the ports of the slave BA RC network. Each port on the BA RC network for the master node has an analogous port for the duplicate BA RC network for the slave node. The core cell connected to an RC port on the master node will have a connection to a column (or row) node; this is not the node corresponding to the current master BA RC network. This node will be connected to many core cells; one of which is connected to the slave node. These two core cells are analogous of each other (master core cell and slave core cell).

According to the novel process, the instance and port information from the slave core cell is used to synthesize the missing connectivity information for the slave RC network.

These and other objects and advantages of the present invention will become obvious to those of ordinary skill in the art after having read the following detailed description of the preferred embodiments which are illustrated in the various drawing figures.

BRIEF DESCRIPTION OF THE DRAWINGS

The operation and components of this invention can be best visualized by reference to the drawings.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention. At times, concepts disclosed in this discussion of embodiments of the present invention will be made more readily apparent be reference to the Figures.

Figure 1:
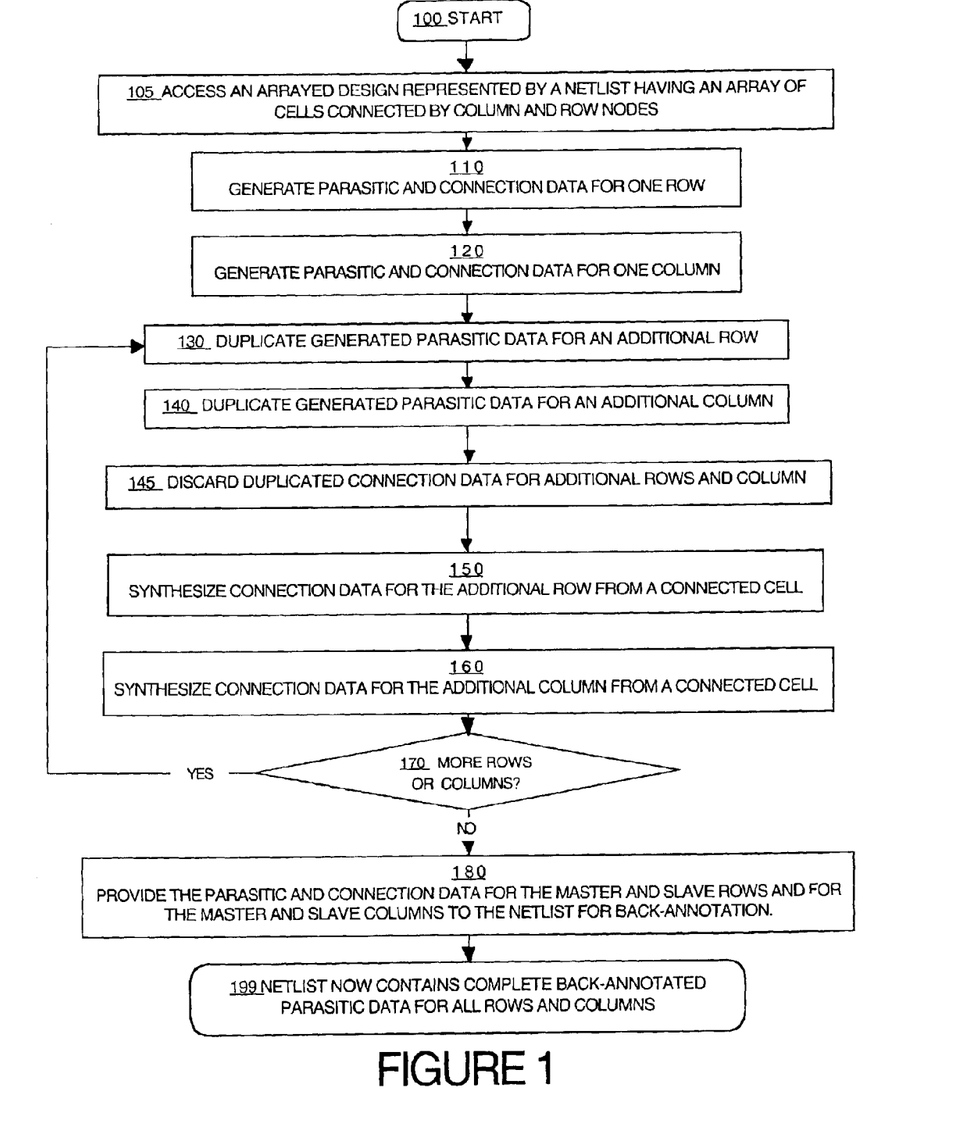
FIG. 1 illustrates a process flow chart in accordance with one embodiment of the present invention.

One embodiment of the present invention is illustrated in flowchart form in FIG. 1. Process 100, of extracting netlist back-annotation information, commences at step 105 by accessing an arrayed circuit design as it is represented in a netlist. The arrayed circuit design can be any circuit or circuit portion that comprises rows and columns of repeated identical cells. By comprising rows and columns, it is a rectangular array. Next, parasitic information is generated at step 110 for a row in the rectangular array of cells and at 120 for a column in the rectangular array.

This embodiment of the present invention continues in FIG. 1 with the duplication of the back-annotation information generated above. Row, step 130, and column, step 140, back-annotation information is duplicated for the rows and columns in consideration that did not have information generated.

The duplicated information includes the resistance and capacitance information generated above at 110 and 120 and also includes connection information for the generated row and column. Resistance and capacitance, which are discussed at length below, generally are identical for identical cells in equivalent locations in different rows and different columns. Connection information, however, is unique to each row and column. The connection information included in the generated information from 110 and 120 is discarded for all rows and columns for which parasitic information is not generated, at 145. New connection information is synthesized at step 150 and step 160 for rows and columns, respectively. If there are more rows and/or columns in the netlist without parasitic information, 170, the process continues until complete. The information thus derived is provided to a netlist for back-annotation, step 180, and the post-layout netlist is ready for post-layout simulation, 199.

It is noted that the cells in consideration in this description of this embodiment of the present invention can be in any repeated-cell array device, as in a memory device such as SRAM or DRAM or an LCD display. The type of repeated cell may be any well-known type. The term "rectangular array" is used to describe the two-dimensional logical arrangement of cells, not their physical relationship. Devices to which this embodiment can be applied include physically rectangular arrays, arrays of grouped arrays, polar arrays and any other physical arrangement wherein groups of cells are connected by logically intersecting electronic connections. Embodiments of the present invention can also perform extraction in three-dimensional arrays.

It is further noted here that generation of parasitic information is generally applied to a process of using computerized knowledge of a device layout design to evaluate its properties prior to actual implementation in silicon. The parasitic information is determined from known properties of the layout and materials used. However, other methods of parasitic information generation can be used in embodiments of the present invention.

The parasitic information thus generated is normally back-annotated into the pre-layout netlist to generate a post-layout netlist. The post-layout netlist is then used to simulate and verify the device. Some information required in device operation is best learned from post-layout, pre-fabrication, simulation. As was noted earlier, generating parasitic information by computer-evaluating every element can be cost-prohibitive in a complex device. Embodiments of the present invention are capable of achieving very large savings in the process.

In this description of this embodiment of the present invention, the pre-layout netlist describes the designed circuit in limited terms. In a memory design, for example, the pre-layout netlist will include the row and column location of a cell as well as the location of the driver for each row and column. However, the netlist does not yet include device parasitic information.

It is noted here that, without parasitic information in the netlist, a simulation program can only approximate the behavior of very high-speed, sub-micron, electronic features such as memory cells. Parasitic information, as it is used in this description, includes the line resistances and capacitances that alter behavior, especially in timing, of fast and small elements. In a netlist, the design information related to a row or column comprises a node with ports. In the memory example, each of the repeated memory cells is represented in the netlist as an instance in a node. When a netlist is back-annotated, the node becomes a resistance/capacitance (RC) network with ports.

It is also noted here that the parasitic resistances and capacitances included in the back-annotated information develop from the inevitable relationships of elements formed in a semiconductor material. The values of resistance and capacitance are determined from the physical layout of the arrayed circuit which, due to requirements of physical implementation, do not necessarily match logical layouts. The length and bulk of conductors connecting elements, for example, are determining factors in calculating the conductor's parasitics and are known quantities once computer-aided layout results in a fixed conductor size. It is after layout that the parasitics are back-annotated into the pre-layout netlist.

It is further noted that netlists can be in a number of different formats and this embodiment of the present invention is applicable to any of them. A typical netlist describes a circuit as a grouping of nodes with ports, instances and interconnections between. A conductor linking a row or column of cells in a memory device is typically described as a node with a very large number of ports and instances. After back-annotation, each node becomes a complex RC network with varying resistances and capacitances between the associated ports. An instance is a cell in the array of cells.

Another embodiment of the present invention uses a separately computed set of connection information. An end user of the tool employing this embodiment of the present invention can supply connection information from an alternative source, such existing knowledge of connection information or a separate program which generates connection information from design criteria or other information.

Figure 2:
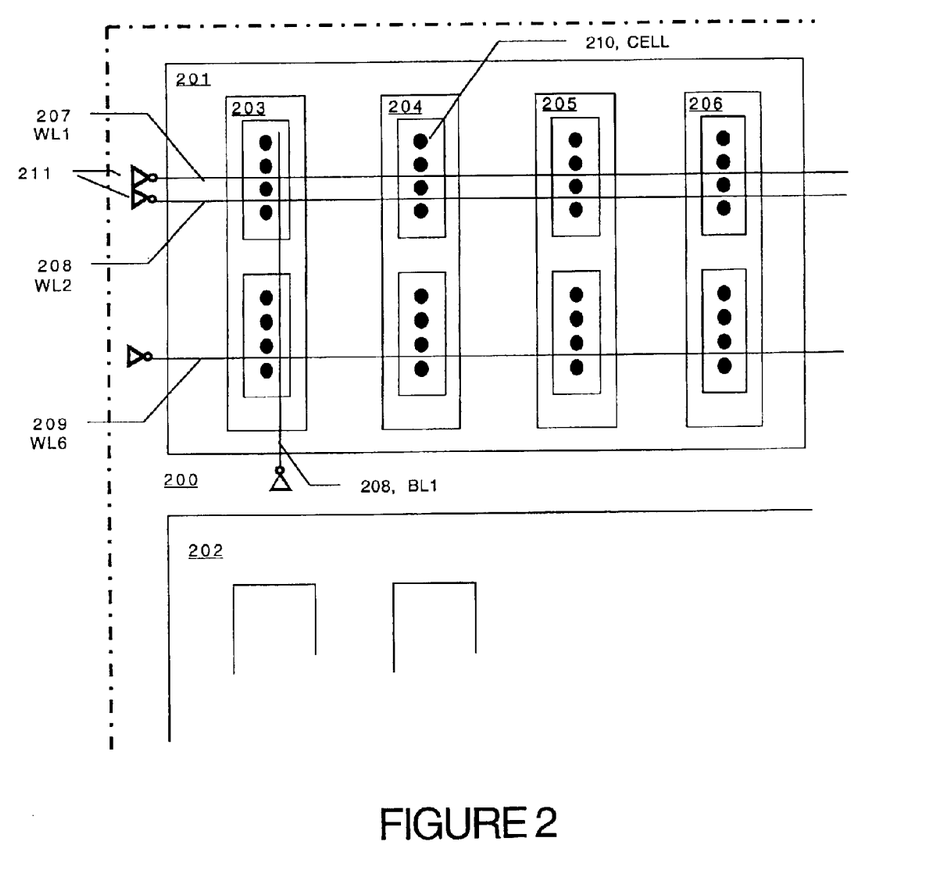
FIG. 2 illustrates a graphical representation of a logical relationship of features in an arrayed circuit device in accordance with one embodiment of the present invention.

A logical block diagram of a portion of a typical memory device, illustrating conductors linking cells, is illustrated in FIG. 2. Exemplary device 200 comprises an array of smaller logical arrays, 201, themselves comprising smaller groupings of elements. In this example, device 200 comprises multiple smaller arrays such as those at 201 and 202. Both arrays 201 and 202 comprise yet smaller arrays of memory cells, such as 210, illustrated at 203–206. In this example, shown to efficiently illustrate the concepts presented in this embodiment of the present invention, each of these smaller arrays comprises two clusters of four memory cells each. In actual practice, this embodiment of the present invention can be applied to arrayed devices with many millions of cells arranged in a wide variety of ways that allow for physical realization and for logical association.

Memory cells, 210 in this illustration, electronically communicate with driving circuitry by means of conductors connecting long lines of cells. Logical bit line 1 (BL1), 208, communicates with cells arranged in a logical column. Word lines 1 and 2 (WL1, WL2, WL6), 207, 208 and 209, communicate with cells in logical rows. It is noted again here that a logical relationship does not mandate a particular physical relationship. The demands of layout of a large complex device can drive the physical location of cells to positions that do not match their relationships in logic.

Line drivers 211 are illustrated in FIG. 2 in order to show that there are other connections to each line in addition to the replicated core cells. In a DRAM device, for example, a bit-line node is likely to be connected to many DRAM bit cells, one sense-amp and perhaps one precharge cell. Similarly for a word line in a DRAM there are likely to be many DRAM bit cells but only one word line driver.

It is noted that, in some devices, the demands of physical implementation can cause some cells to be oriented differently from row to row or from column to column. Some devices comprise columns that are mirror images of each other. In cases such as these, an embodiment of the present invention uses parasitic information from each different version of the column. Separate sets of parasitic information are also used in the case of differing types of rows. However, requiring a set of generated parasitic information from each exemplary row and column does not alter the functions of these embodiments.

While bit lines and word lines are implemented logically as conductors, their physical realization in silicon results in conductors with resistance and capacitance, as noted earlier. These attendant resistances and capacitances are the parasitic characteristics that affect the behavior and operation of the cells in operation.

Figure 3:
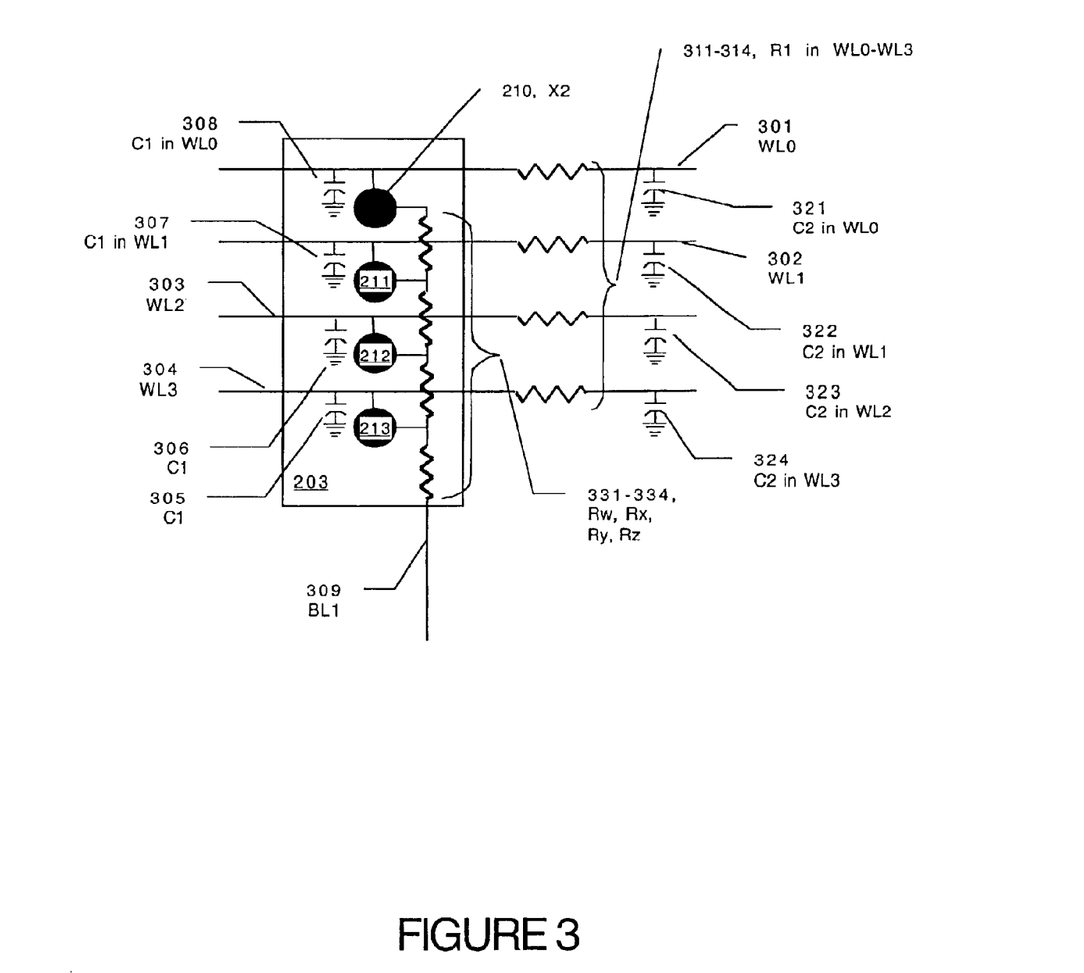
FIG. 3 illustrates a graphical representation of parasitic characteristics in an arrayed circuit device in accordance with one embodiment of the present invention.

FIG. 3 illustrates the logical realization of parasitic resistance and capacitance in a memory cell cluster. Memory cell cluster 203 is illustrated with four memory cells here for the sake of illustration. As stated above, a device can be of virtually any physical makeup when in consideration in this embodiment of the present invention. While in this example, rows and columns of memory cells are arranged in rows and columns of clusters, this embodiment of the present invention can accommodate any arrangement in which there is a logical two-dimensional arrangement of repeated cells.

As was also shown in FIG. 2, FIG. 3 illustrates the connectivity of a word line (WL) and a bit line (BL) to each cell. Memory cell 210 connects to both WL0, 301, and to BL1, 309. BL1 also connects to cells 211, 212 and 213 in a logical column with cell X2, 210, that connect with WL1, 302, WL2, 303, and WL3, 304. It is noted that the terms BL, WL, X, etc are common terms in netlist usage.

Also illustrated in FIG. 3 are capacitors C1, 305–308, capacitors C2, 321–324, resistors R1, 311–314, and resistors Rw, Rx, Ry and Rz, 331–334. It is noted again that these features are not physically implemented in the layout of the device in question but are representations of the parasitic values attendant to the physical layout of the cells and their connections.

In the operation of this embodiment of the present invention, resistors R1, shown at 311–314, are essentially analogous in layout because the resistances are generated by the length and bulk of conductors. Because word line wl0–wl3 are copies of each other, the parasitics of each feature in the word lines have analogous values, hence a common netlist tag "R1" in FIG. 3. Capacitors C2, shown at 321–324, as well, are analogous in value because the feature parasitics that form them are analogous. In each case, these value identities derive from fact that the arrayed devices are arrays of repeated, analogous cells, connected by repeated analogous connections. For this reason, the parasitic values of one word line, for example, are duplicated in all other identical word lines in the operation of this embodiment of the present invention.

However, connection information, on which netlists are based, differs from word line to word line and from bit line to bit line. Differing connection information has driven the need to evaluate all cells and all nodes (connections) in processes in the past. The commonality of connection information of a cell at the intersection, though, is exploited in this embodiment of the present invention.

Figure 4:
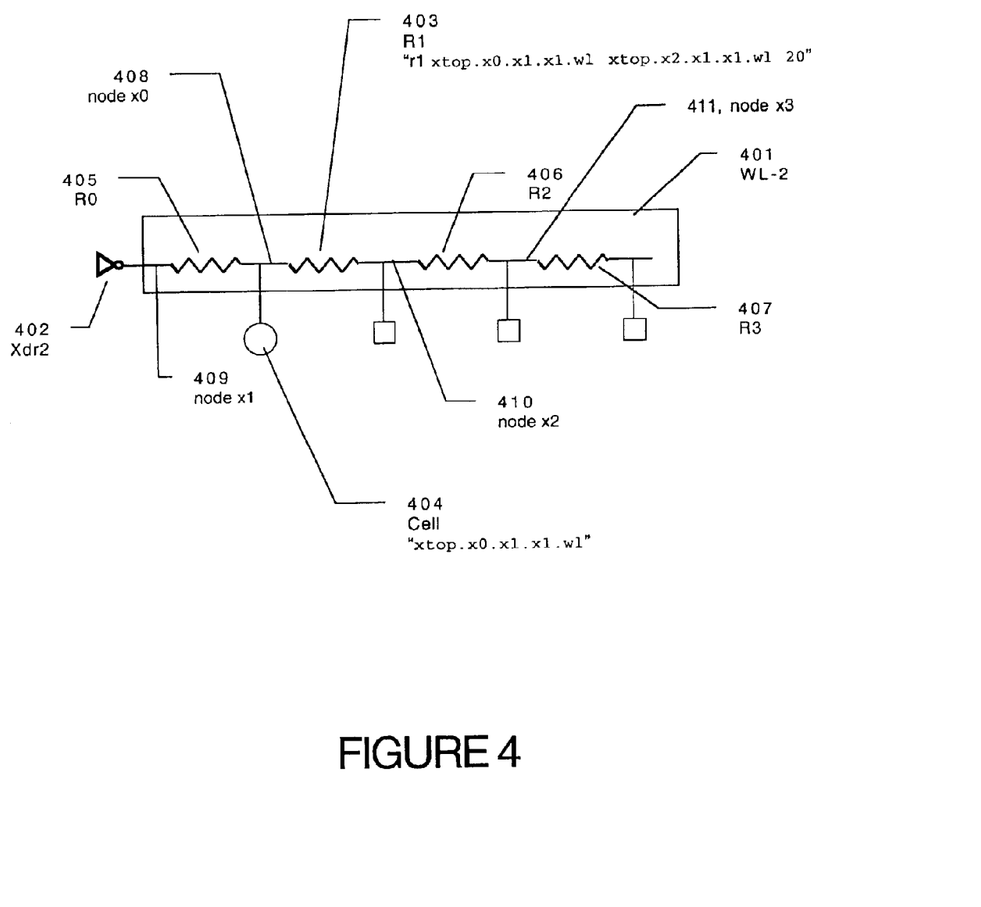
FIG. 4 illustrates a graphical representation of a word line in accordance with one embodiment of the present invention.
Figure 5:
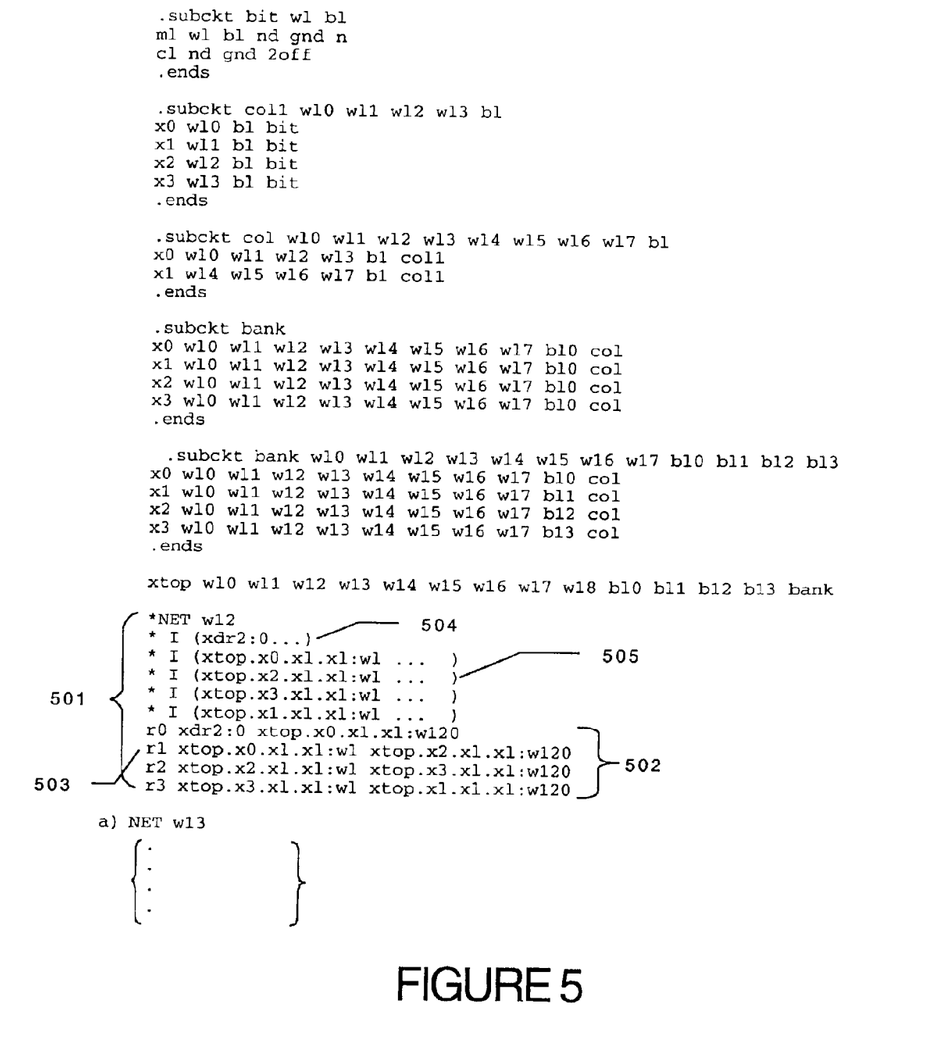
FIG. 5 illustrates an exemplary netlist in accordance with one embodiment of the present invention.

FIG. 4 illustrates the logical relationship of parasitic characteristics as back-annotated. FIG. 4 is best seen in view of FIG. 5 which, though it illustrates a typical netlist in a common format, is not to be construed as limiting this embodiment of the present invention to any particular format. Portions of the netlist illustrated in FIG. 5 can be applied to the concepts illustrated graphically in FIG. 4. In a back-annotated netlist, a word line is a network of elements listed by connections. Word line WL2, shown at 401 in this example, is netlisted at 501 in FIG. 5. The back-annotated values and connections for resistances r0–r3 are shown in FIG. 5 at 502.

The graphical representation of these back-annotated resistances is shown in FIG. 4 at 403, 405, 406 and 407. Resistance R1, for example, is shown at 403 and the netlist connection is shown. R1 is represented in the back-annotated netlist at 503 in FIG. 5. Both connections and value are listed. Word line WL2 driver "xdr2" shown at 402 in FIG. 4 and at 504 in FIG. 5. Also shown in FIG. 4 are graphical representations of the cell connection to node X0 shown at 404, node X0 at 408, node X1 at 409, node X2 at 410, and node X3 at 411. It is noted that the netlist connection line of cell 404 is also shown in FIG. 4 as well as FIG. 5 at 505.

As was shown in FIG. 1 at 110–140, parasitic resistance and capacitance information is generated for a single evaluated word line and a single evaluated bit line in an arrayed circuit to be simulated. The generated parasitic information is duplicated for all other word lines and bit lines in the circuit and is valid because of the aforementioned identity of the word lines or bit lines. Connection information for the word line and bit line actually evaluated, however, is only valid for the evaluated lines and is not duplicated for other lines.

In netlist terms, each port on the back annotated RC network for the evaluated node has an analogous port for the duplicate back annotated RC network for the non-evaluated node being considered. The core cell connected to an RC port on the evaluated node will have a connection to a column or row node, as in the example of FIG. 5. This node is connected to many core cells, one of which is connected to the non-evaluated node. These two core cells, evaluated core cell and non-evaluated core cell, are analogues of each other. The instance and port information from the non-evaluated core cell is used to synthesize the missing connectivity information for the non-evaluated RC network.

In order to provide connection information for the non-evaluated word lines and bit lines, a cell at the intersection of the evaluated word line and bit line is examined. Connection information, valid in the evaluated word line for the intersection cell is also valid in the bit line. Once the intersection cell is identified in its position in the word line, for instance, its connection information establishes its position in the bit line and is also valid for the identical cells in non-evaluated bit lines. Since each bit line is a repeat of the others, the cell in the bit line that intersects with the word line is the same in all considered bit lines. With connection information established at the intersection, the relative connection information for remaining cells in each bit line is extrapolated. With duplicated parasitic information and thus synthesized connection information, a valid netlist back-annotation can be accomplished for the non-evaluated bit lines. The analogous process is accomplished for word lines.

The synthesis of connection information and duplication of parasitic information saves billions of meticulous operations in a device verification. Such savings are immense when expanded over the entirety of a large memory or other device.

Figure 6:
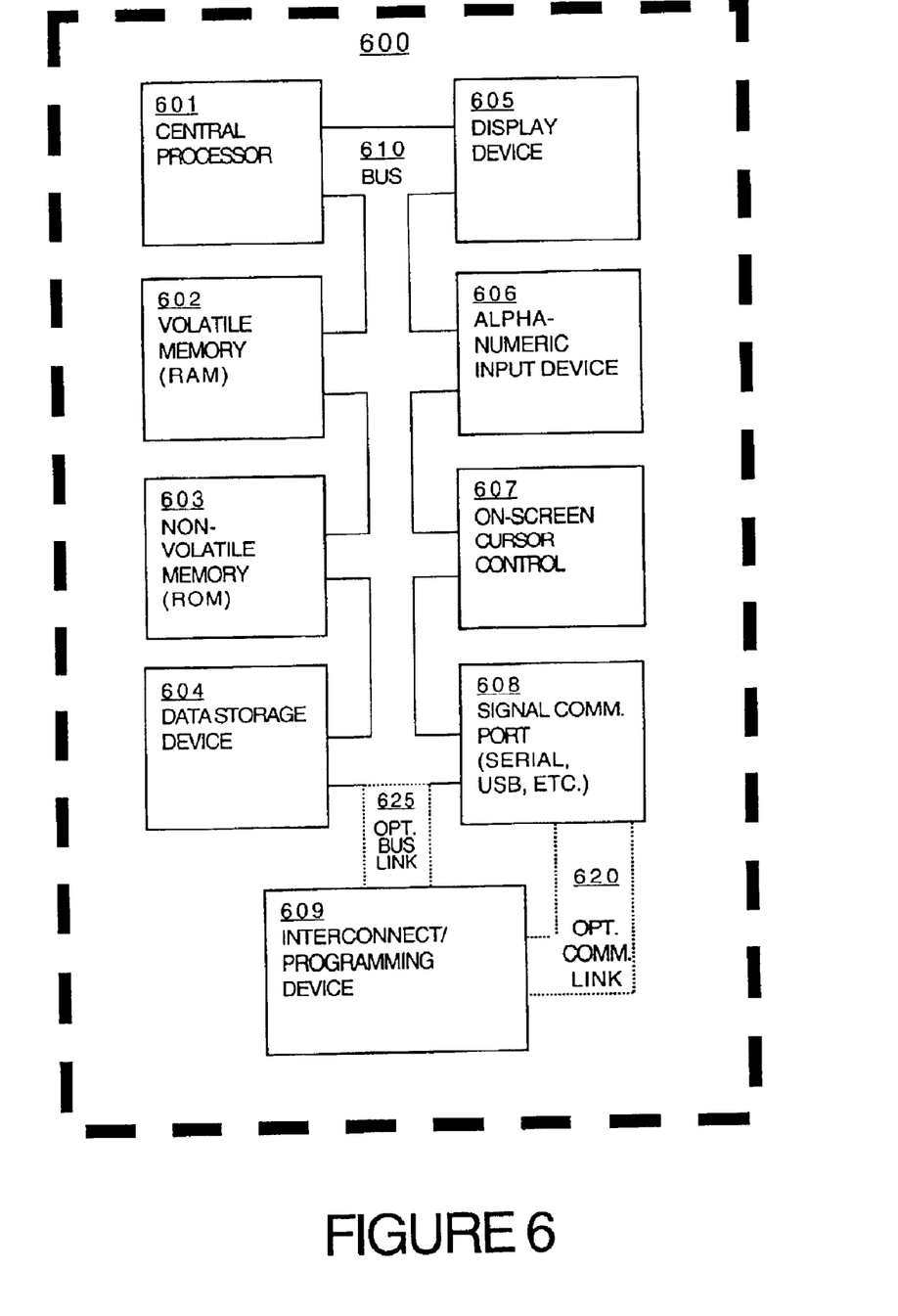
FIG. 6 illustrates a generic computer system on which embodiments of the present invention may operate.

The processes involved in the operation of this embodiment of the present invention are envisioned as being carried out in a computer system. A generic computer system is illustrated in FIG. 6. It is noted here that this embodiment of the present invention can be implemented in any number of computer architectures and the particular architecture chosen for FIG. 6 is solely for the sake of illustrative purposes.

In FIG. 6, computer system 600 comprises bus 610 which connects processor 601, volatile RAM 602, non-volatile ROM 603 and permanent data storage device 604. Also connected to the bus are display device 605, usually a monitor; alpha-numeric input device 606, usually a keyboard; cursor control 607, sometimes implemented as a mouse; and signal 110 device 608. Signal I/O device 608 can be implemented as a serial connection, an infrared transceiver, a parallel connection or some other device. Because this embodiment of the present invention involves computer-aided design and testing of integrated circuit devices, computer system 600 may also include a means of direct communication with a device in consideration. That means is represented in this illustration by interconnect/programming device 609 which could also be connected to computer bus 610, whether directly by bus link 625 or indirectly by signal communication device 608 and communication link 620.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for extracting cell parasitic characteristics for netlist back-annotation for an arrayed design comprising a row and column array of repeated cells, said method comprising:

a) generating parasitic and connection data for an evaluated row and an evaluated column of cells in said arrayed design;

b) duplicating said generated parasitic data for an additional row and an additional column in said arrayed design;

c) synthesizing connection data for said additional row from a connected cell in said additional row;

d) synthesizing connection data for said additional column from a connected cell in said additional column;

e) providing said connection data for said additional row from a connected cell in said additional row for back-annotating said netlist; and f) providing said connection data for said additional column from a connected cell in said additional column for backannotating said netlist.

2. A method as described in claim 1, further comprising repeating steps a) through f) for a plurality of additional rows and additional columns.

3. A method as described in claim 1, wherein said arrayed design is a memory circuit design.

4. A method as described in claim 1, wherein said arrayed design is an LCD device design.

5. A method as described in claim 1, wherein said connected cell in said additional row is connected in said evaluated column.

6. A method as described in claim 1, wherein said connected cell comprises an intersection of said additional row and said evaluated column.

7. A method as described in claim 1, wherein said connected cell in said additional column is connected in said evaluated row.

8. A method as described in claim 1, wherein said arrayed design comprises a replicated core cell.

9. A method as described in claim 1, wherein said connected cell comprises an intersection of said additional column and said evaluated row.

10. A method as described in claim 1, wherein said parasitic data comprises resistance and capacitance.

11. A method as described in claim 1, wherein said parasitic data comprises an RC network.

12. A system for extracting cell parasitic characteristics for netlist back-annotation, comprising:

a computer comprising a memory and a processor;

a netlist comprising element characteristics and nodes of a circuit design comprising a row and column array of repeated cells;

generated data comprising parasitic and connection data for a row and a column of said cells in said circuit design;

duplicated parasitic data for an additional row and an additional column in said circuit design;

synthesized connection data for said additional row derived from a connected cell in said additional row; and synthesized connection data for said additional column derived from a connected cell in said additional column, wherein said computer is enabled to back annotate said netlist with said duplicated data and said synthesized data.

13. A system as described in claim 12, wherein said parasitic characteristics comprise resistances.

14. A system as described in claim 12, wherein said parasitic characteristics comprise capacitances.

15. A system as described in claim 12, wherein said circuit design is a memory circuit design.

16. A computer system comprising a memory coupled to a bus and a processor wherein said memory comprises instructions that when executed implement a method for extracting cell parasitic characteristics for netlist back-annotation for an arrayed design comprising a row and column array of repeated cells, said method comprising:

a) generating parasitic and connection data for an evaluated row and an evaluated column of cells in said arrayed design;

b) duplicating said generated parasitic data for an additional row and an additional column in said arrayed design;

c) synthesizing connection data for said additional row from a connected cell in said additional row;

d) synthesizing connection data for said additional column from a connected cell in said additional column;

e) back-annotating said netlist with said connection data for said additional row from a connected cell in said additional row; and f) back-annotating said netlist with said connection data for said additional column from a connected cell in said additional column.

17. A method as described in claim 16, wherein said arrayed design is a memory circuit design.

18. A method as described in claim 16, wherein said arrayed circuit is an LCD device.

19. A method as described in claim 16, wherein said connected cell in said additional row is connected in said evaluated column.

20. A method as described in claim 16, wherein said connected cell comprises an intersection of said additional row and said evaluated column.

21. A method as described in claim 16, wherein said connected cell in said additional column is connected in said evaluated row.

22. A method as described in claim 16, wherein said arrayed circuit is a replicated core cell.

23. A method as described in claim 16, wherein said connected cell comprises an intersection of said additional column and said evaluated row.

24. A method as described in claim 16, wherein said parasitic data comprises resistance and capacitance.

25. A method as described in claim 16, wherein said parasitic data comprises an RC network.

* * * * *